(12) United States Patent
Peting

(10) Patent No.: US 12,301,183 B2
(45) Date of Patent: May 13, 2025

(54) SWITCHING AUDIO AMPLIFIER WITH IMPROVED VOLTAGE SUPPLY CONTROL

(71) Applicant: SKYWORKS SOLUTIONS, INC., Irvine, CA (US)

(72) Inventor: Mark R. Peting, Yamhill, OR (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 413 days.

(21) Appl. No.: 17/936,451

(22) Filed: Sep. 29, 2022

(65) Prior Publication Data

US 2023/0099606 A1    Mar. 30, 2023

Related U.S. Application Data

(60) Provisional application No. 63/250,758, filed on Sep. 30, 2021.

(51) Int. Cl.
*H03F 3/217* (2006.01)
*H03F 1/30* (2006.01)
*H03F 3/185* (2006.01)

(52) U.S. Cl.
CPC .......... *H03F 3/2173* (2013.01); *H03F 1/305* (2013.01); *H03F 3/185* (2013.01); *H03F 2200/03* (2013.01); *H03F 2200/351* (2013.01)

(58) Field of Classification Search
CPC ........ H03F 3/2173; H03F 1/305; H03F 3/185; H03F 2200/03; H03F 2200/351; H03F 1/025; H03F 3/2175
USPC ....................................... 330/10, 251, 207 A
See application file for complete search history.

(56) References Cited

U.S. PATENT DOCUMENTS

| | | | |
|---|---|---|---|
| 7,443,200 B2 | 10/2008 | Quinn et al. | |
| 8,207,788 B2 | 6/2012 | Lee et al. | |
| 8,643,436 B2* | 2/2014 | Ni | H03F 3/217 330/251 |
| 10,483,924 B2* | 11/2019 | Das | H03F 1/025 |
| 11,290,069 B2 | 3/2022 | He et al. | |
| 2018/0337636 A1 | 11/2018 | Martinez et al. | |
| 2018/0337645 A1 | 11/2018 | Link et al. | |
| 2019/0214950 A1 | 7/2019 | Quinn | |
| 2020/0228076 A1 | 7/2020 | Lee | |
| 2021/0012763 A1 | 1/2021 | Wurtz | |
| 2023/0102992 A1 | 3/2023 | Peting et al. | |

* cited by examiner

*Primary Examiner* — Hieu P Nguyen
(74) *Attorney, Agent, or Firm* — Lando & Anastasi, LLP

(57) ABSTRACT

A switching audio amplifier and method of operation. The switching audio amplifier comprises a voltage supply selector coupling a power supply input to a first power supply voltage; a switching circuit generating a drive signal for a loudspeaker by modulating the power supply input based on a modulation signal; a pulse generator receiving an audio input signal and outputting the modulation signal based on the audio input signal and the voltage of the power supply input; and a supply voltage monitor. The supply voltage monitor is configured to increase the voltage of the power supply input by causing the voltage supply selector to couple the power supply input to a second power supply voltage responsive to the modulation signal exceeding the first threshold, and the supply voltage monitor preventing the voltage supply selector from reducing the voltage of the power supply input for a first time period.

21 Claims, 6 Drawing Sheets

SWITCHING AUDIO AMPLIFIER WITH IMPROVED VOLTAGE SUPPLY CONTROL

CROSS-REFERENCE TO RELATED APPLICATIONS

This application claims priority under 35 U.S.C. § 119(e) to U.S. Provisional Application No. 63/250,758, titled A SWITCHING AUDIO AMPLIFIER WITH IMPROVED VOLTAGE SUPPLY CONTROL, filed Sep. 30, 2021, which is incorporated by reference in its entirety for all purposes.

BACKGROUND

Field

Embodiments of the present disclosure relate to systems and methods related to amplifiers for use in amplifying audio signals, and in particular, to switching amplifiers.

Description of the Related Technology

In many audio applications, amplifiers amplify audio signals and provide the amplified signals to loudspeakers, so that the audio signals can be heard. When implemented in a low power audio device, such as a portable audio product having a limited power source (e.g., a battery), multiple voltage supply levels may be provided to the amplifier so that the operating voltage supply level of the amplifier can be selected based on the audio signal to be amplified, thus allowing a longer operating period with the limited power source.

In a Class D amplifier (also called a switching amplifier), pulses are generated by a modulator of a fixed amplitude but varying width and separation (or a varying number of pulses per unit time) representing the amplitude variations of an analog or digital audio input signal. Conventionally, the modulator compares analog voltages against a particular waveform, usually a triangular waveform, to decide how wide a pulse of a digital signal should be. The output of the modulator is then used to turn output transistors on and off (sometimes called "gating" the transistors), thus creating the signal for driving the loudspeakers. A low-pass filter may be used to provide a path for the low-frequencies of the audio signal to output to loudspeakers of the low power audio device while filtering out the high frequency pulses of the modulator.

SUMMARY

According to aspects and elements of the disclosure, there is provided a switching audio amplifier, comprising a voltage supply selector, a switching circuit, a pulse generator and a supply voltage monitor. The voltage supply selector is configured to couple a power supply input to a first power supply voltage of a plurality of power supply voltages. The switching circuit is configured to generate a drive signal for driving a loudspeaker by modulating the power supply input based on a modulation signal. The pulse generator is configured to receive an audio input signal and to output the modulation signal based on the audio input signal and the voltage of the power supply input such that the drive signal generated by the switching circuit corresponds to the audio input signal. The supply voltage monitor is configured to determine whether the modulation signal exceeds a first threshold, the supply voltage monitor being configured to increase the voltage of the power supply input by causing the voltage supply selector to couple the power supply input to a second power supply voltage of the plurality of power supply voltages if the modulation signal is determined to exceed the first threshold, the supply voltage monitor being configured to prevent the voltage supply selector from reducing the voltage of the power supply input for a first time period.

In some examples, the second power supply voltage may be higher than the first power supply voltage.

In some examples, the switching audio amplifier may further comprise a feedback loop, the feedback loop may be configured to measure the drive signal output by the switching circuit and to provide negative feedback error correction between the drive signal and the audio input signal.

In some examples, the supply voltage monitor may be configured to reduce the voltage of the power supply input by causing the voltage supply selector to couple the power supply input to the first power supply voltage if the modulation signal is less than a second threshold and if the first time period has expired.

In some examples, the second threshold may be lower than the first threshold.

In some examples, the switching circuit may be configured to generate a differential drive signal for driving the loudspeaker.

In some examples, the switching circuit may be a H-bridge.

In some examples, the supply voltage monitor may be configured to control the voltage supply selector by encoding a desired voltage of the power supply input in the height of the modulation signal pulses output by the pulse generator.

In some examples, the supply voltage monitor may be configured to control the voltage supply selector by encoding a desired voltage of the power supply input in a code that is communicated to the voltage supply selector.

In some examples, the supply voltage monitor may be configured to store the first threshold in a supply control register.

In some examples, the voltage supply selector may comprise a plurality of transistors configured to open or close to make or break a connection between the power supply input and the plurality of power supply voltages.

In some examples, the modulation signal may be a pulse width modulation signal or a pulse density modulation signal.

According to an embodiment, there is provided a packaged module comprising a packaging substrate and a switching audio amplifier. The switching audio amplifier may be implemented on the packaging substrate and comprise a voltage supply selector configured to couple a power supply input to a first power supply voltage of a plurality of power supply voltages; a switching circuit configured to generate a drive signal for driving a loudspeaker by modulating the power supply input based on a modulation signal; a pulse generator configured to receive an audio input signal and to output the modulation signal based on the audio input signal and the voltage of the power supply input such that the drive signal generated by the switching circuit corresponds to the audio input signal; and a supply voltage monitor configured to determine whether the modulation signal exceeds a first threshold, the supply voltage monitor being configured to increase the voltage of the power supply input by causing the voltage supply selector to couple the power supply input to a second power supply voltage of the plurality of power supply voltages if the modulation signal is determined to exceed the first threshold, the supply voltage monitor being configured to prevent the voltage supply selector from reducing the voltage of the power supply input for a first time period.

According to an embodiment, there is provided an electronic device comprising a voltage supply selector, a switching circuit, a pulse generator and a supply voltage monitor. The voltage supply selector is configured to couple a power supply input to a first power supply voltage of a plurality of power supply voltages. The switching circuit is configured to generate a drive signal for driving a loudspeaker by modulating the power supply input based on a modulation signal. The pulse generator is configured to receive an audio input signal and to output the modulation signal based on the audio input signal and the voltage of the power supply input such that the drive signal generated by the switching circuit corresponds to the audio input signal. The supply voltage monitor is configured to determine whether the modulation signal exceeds a first threshold, the supply voltage monitor being configured to increase the voltage of the power supply input by causing the voltage supply selector to couple the power supply input to a second power supply voltage of the plurality of power supply voltages if the modulation signal is determined to exceed the first threshold, the supply voltage monitor being configured to prevent the voltage supply selector from reducing the voltage of the power supply input for a first time period.

According to an embodiment, there is provided a method for controlling a switching audio amplifier. The method comprises coupling, by a voltage supply selector, a power supply input to a first power supply voltage of a plurality of power supply voltages; generating, by a switching circuit, a drive signal for driving a loudspeaker by modulating the power supply input based on a modulation signal; receiving, by a pulse generator, an audio input signal; outputting, by the pulse generator, the modulation signal based on the audio input signal and the voltage of the power supply input such that the drive signal generated by the switching circuit corresponds to the audio input signal; determining, by a supply voltage monitor, whether the modulation signal exceeds a first threshold; causing, by the supply voltage monitor, if the modulation signal is determined to exceed the first threshold, the voltage supply selector to increase the voltage of the power supply input by coupling the power supply input to a second power supply voltage of the plurality of power supply voltages; and preventing, by the supply voltage monitor, the voltage supply selector from reducing the voltage of the power supply input for a first time period.

In some examples, the second power supply voltage may be higher than the first power supply voltage.

In some examples, the method may further comprise measuring, by a feedback loop, the drive signal output by the switching circuit and providing negative feedback error correction between the drive signal and the audio input signal.

In some examples, the method may further comprise reducing, by the supply voltage monitor, the voltage of the power supply input by causing the voltage supply selector to couple the power supply input to the first power supply voltage if the modulation signal is less than a second threshold and if the first time period has expired.

In some examples, the second threshold may be lower than the first threshold.

In some examples, the method may further comprise generating, by the switching circuit, a differential drive signal for driving the loudspeaker.

In some examples, the switching circuit may be a H-bridge.

In some examples, the method may further comprise controlling, by the supply voltage monitor, the voltage supply selector by encoding a desired voltage of the power supply input in the height of the modulation signal pulses output by the pulse generator.

In some examples, the method may further comprise controlling, by the supply voltage monitor, the voltage supply selector by encoding a desired voltage of the power supply input in a code that is communicated to the voltage supply selector.

In some examples, the method may further comprise storing, by the supply voltage monitor, the first threshold in a supply control register.

In some examples, the method may further comprise opening or closing, by the voltage supply selector, a plurality of transistors to make or break a connection between the power supply input and the plurality of power supply voltages.

In some examples, the modulation signal may be a pulse width modulation signal or a pulse density modulation signal.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Aspects and embodiments described herein are directed to an amplifier for converting analog or digital audio data to a speaker signal using a class D or switching amplifier, which may drive a signal using a voltage supply from one of a plurality of voltage supply rails. The amplifier includes an improved amplifier block that is configured to select a supply voltage of a plurality of supply voltages, based on an audio input signal, to be coupled to the amplifier output driver to output a target voltage/current while optimizing for power efficiency. The improved amplifier block implements new logic to improve the stability of the supply voltage selection. In particular, the improved amplifier block prevents the supply voltage from being reduced for a given time duration immediately after the supply voltage has been increased, thus reducing power consumption from switching losses across the switching amplifier and the supply voltage selection circuit while also minimizing the use of unnecessary voltage supply levels.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

In some Class D, or switching, audio amplifiers, an analog or digital audio signal is received and converted into a train of pulses, with the width of the pulses and the separation between successive pulses representing the varying amplitude of the received audio signal. The pulse train may then be used to control the gates of a pair of transistors to switch them on and off to output a current based on the received audio signal to an electrically connected load, such as a loudspeaker.

Figure 1:
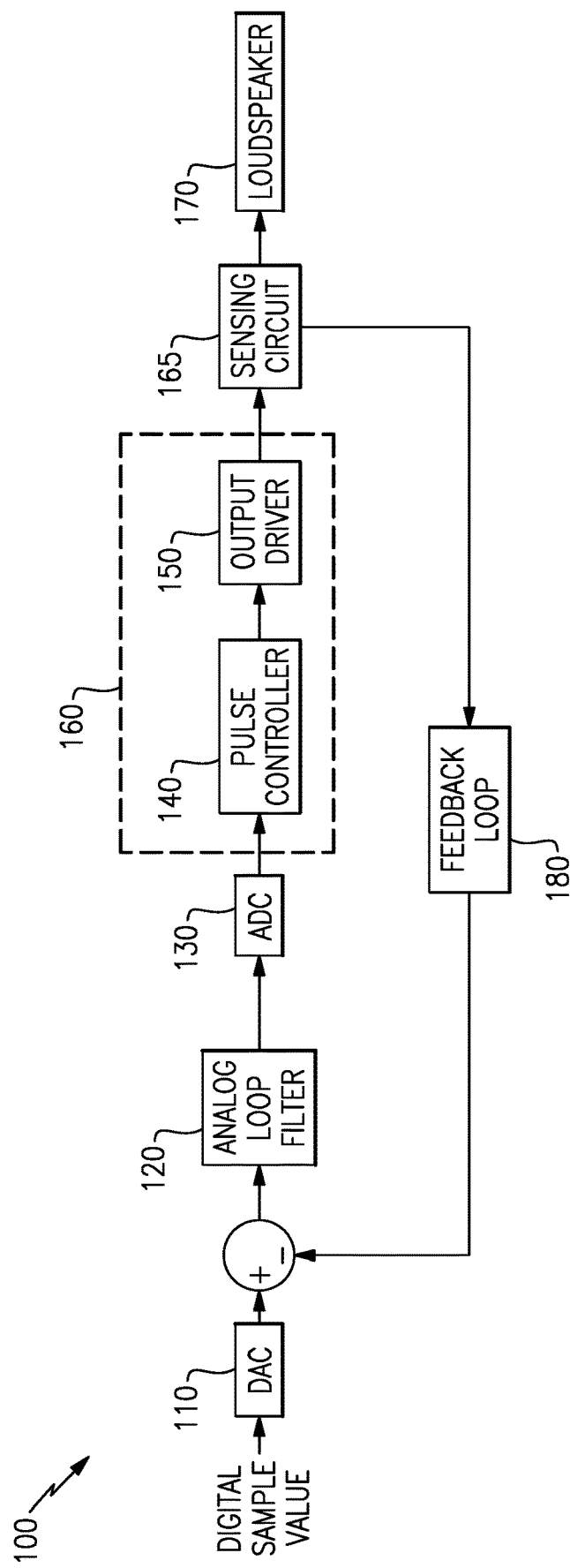
FIG. 1 is a block diagram of an amplifier according to aspects of the present disclosure.

FIG. 1 illustrates an example block diagram of a Class D amplifier 100 according to aspects of the present disclosure. In FIG. 1, a series of digital sample values corresponding to audio content are received at an input and passed to a high precision digital-to-analog converter (DAC) 110. The DAC 110 converts the digital sample values into an analog audio signal. The analog audio signal is then passed from the DAC 110 to an analog loop filter 120 for filtering prior to being sent to an analog-to-digital converter (ADC) 130. In some embodiments, the ADC 130 may be a successive approximation register (SAR) ADC. A pulse controller 140 receives a digital signal from the ADC 130, and outputs a pulse train signal to the output driver 150. The output driver 150 may then output a drive signal to the load of a loudspeaker 170 for reproducing the audio signal corresponding to the received digital sample values. In some embodiments, the output driver 150 may output a differential signal with the respective signal lines being connected across the loudspeaker load such that the loudspeaker 170 is driven with a push-pull topology.

The amplifier 100 includes a sensing circuit 165 that is configured to guide a portion of the drive signal output from the output driver 150 back into the analog loop filter 120 via a feedback loop 180, for example by using sense resistors. The feedback loop 180 may then be used to provide negative feedback error correction in the amplifier 100 using a subtractor summing circuit to provide a signal corresponding to the difference between the analog audio signal output by the DAC 110 and the drive signal that arrives at the subtractor from the sensing circuit 165 and the feedback loop 180, with the summed signal being input into the analog loop filter 120. In this manner, the analog loop filter 120 is responsible for keeping the amplifier 100 stable and locking the output of the output driver 150 to the input requested by the digital sample values received by the DAC 110. The analog loop filter 120 may be configured to provide a high loop gain over the band of audio frequencies to amplify the error between the output drive signal and the output of the DAC 110. The error amplification may be implemented using a fifth order loop filter, for example, which may be configured to amplify the error by approximately one thousand. However, it will be appreciated that embodiments of the disclosure are not limited to such fifth order loop filters, and that other levels of error amplification are possible (for example, amplifying the error by more or less than one thousand). The high gain from the loop filter 120 can ensure that the output and the desired signal are very closely matched by amplifying the error. Rather than using conventional techniques of processing data in analog form, the feedback may be implemented to process the data in digital form using the ADC 130, which may output a digital signal representing the analog signal. The pulse controller 140 may be configured to receive the digital signal from the ADC 130 and to output a pulse having a width based on the analog signal.

Furthermore, unlike conventional switching amplifiers where the pulses only go between a high and a low voltage rail, the pulse controller 140 can select a voltage of a plurality of voltages for connection across the gates of the pair of transistors of the output driver 150. Instead of using a low modulation of a high voltage supply rail to output the voltage/current drive signal needed to drive the loudspeaker 170 to reproduce the desired audio signal, a higher modulation of a lower voltage supply rail can be used. Using a higher modulation of a lower voltage supply rail allows for higher efficiency of the amplifier 100 during switching for these portions of the desired audio signal because the lower output swing in the switching voltage using the lower voltage supply rail reduces the switching losses that would be incurred if instead using the high voltage supply rail. The selection of the supply voltage to be used may be based on the output of the ADC 130, and may take into account the feedback loop 180 based on measurements of the drive signal output by the output driver 150, and the intended pulse width.

In some examples, the pulses from the pulse controller 140 may vary in height as well as width, with the height of the pulse indicating the intended voltage supply to be used for that pulse. In this manner, the output driver 150 may select the appropriate voltage supply based on the height of the pulse, and transistors connected to the selected voltage supply may be switched on and off based on the width of the pulses. Alternatively, the indication of the intended voltage may be communicated in an analog or digital code sent from the pulse controller 140 to the output driver 150 along with the relevant pulse or pulses to be used in controlling the output driver's switching transistor gates.

In some examples, a plurality of such intermediate voltage supply rails may be provided, e.g., a voltage supply with a voltage $V_H$ may be provided with intermediate voltages of $V_{LL}$, $V_L$, and $V_M$ (where $V_H$ is the highest level voltage, $V_{LL}$ is the lowest level voltage, $V_L$ is the next lowest level voltage, and $V_M$ is a mid-range voltage greater than $V_L$ and less than $V_H$). In this example, rather than switching between $V_{LL}$ and $V_H$, embodiments disclosed herein can switch between 0V and $V_{LL}$, then $V_{LL}$ to $V_L$, and then $V_L$ to $V_M$ or $V_H$, and so forth. The low output swing from switching between one voltage level to the next voltage level improves the overall efficiency of the amplifier 100 and reduces the switching loss of conventional switching amplifiers, which can only switch from high to low and not to intermediate voltages. It will be appreciated that these voltage levels are merely an example and that other voltage supply levels may be implemented. For example, the plurality of power supply voltages may be chosen to be any voltage between 0.1V and 2.0V, such as a battery voltage.

The pulse controller 140 and the output driver 150 may be referred to together herein as an amplifier block 160. In one embodiment, the amplifier block 160 may be implemented as an amplifier block 260 according to FIG. 2. The amplifier block 260 includes a pulse controller 240 and an output driver 250. The pulse controller 240 includes a pulse generator 242 and a supply voltage monitor 244, and the output driver 250 includes a switching circuit 252 and a voltage supply selector 254.

Figure 2:
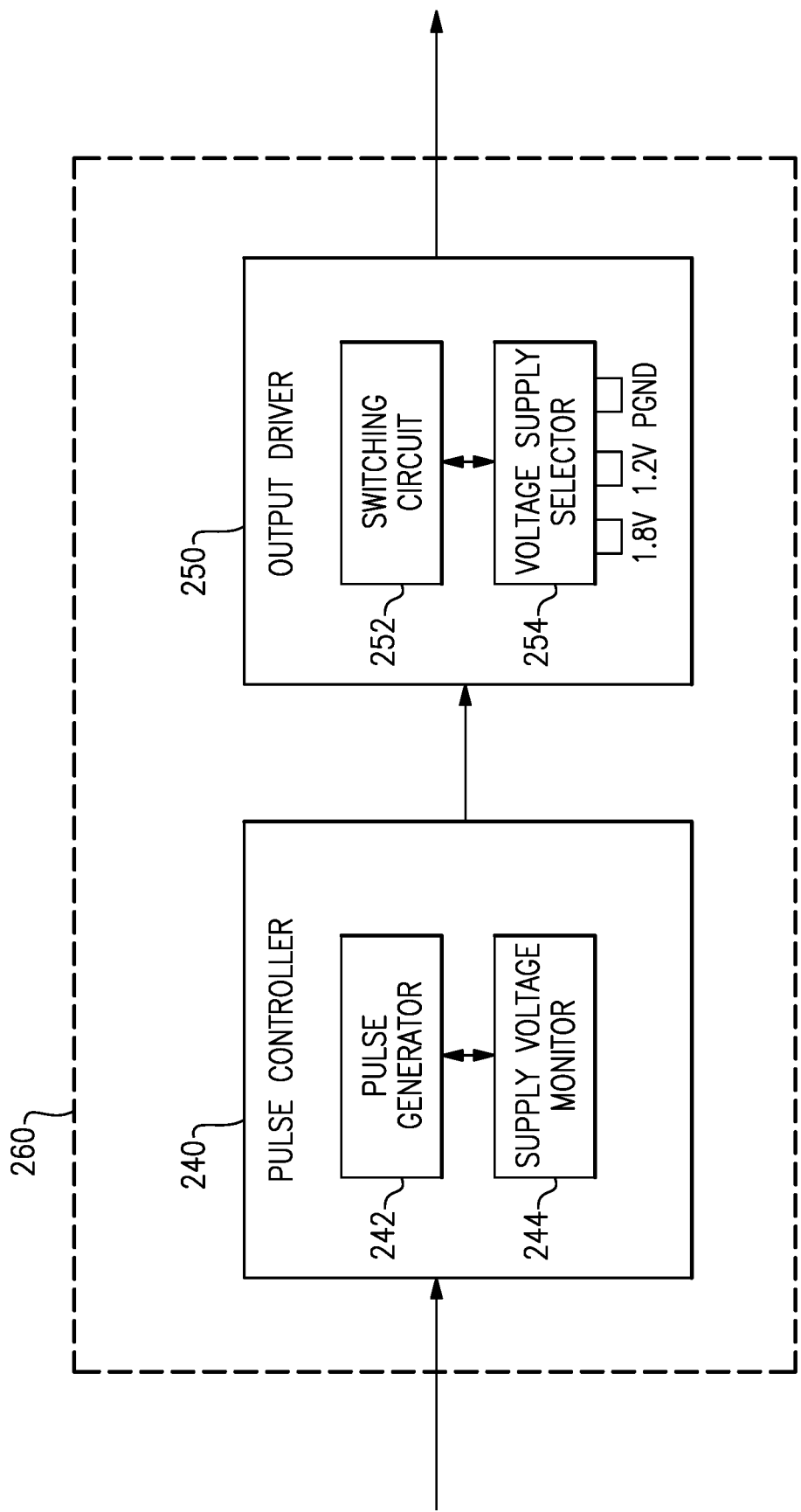
FIG. 2 is a block diagram of an example amplifier block according to aspects of the present disclosure.

The voltage supply selector 254 is configured to receive a plurality of different power supply voltages as well as a ground connection PGND. In FIG. 2, the voltage supply selector 254 is illustrated as receiving power supply voltages of $V_M$ and $V_H$. The voltage supply selector 254 may then control the coupling between this plurality of power supply voltages and the terminals of the switching circuit 252.

Figure 4:
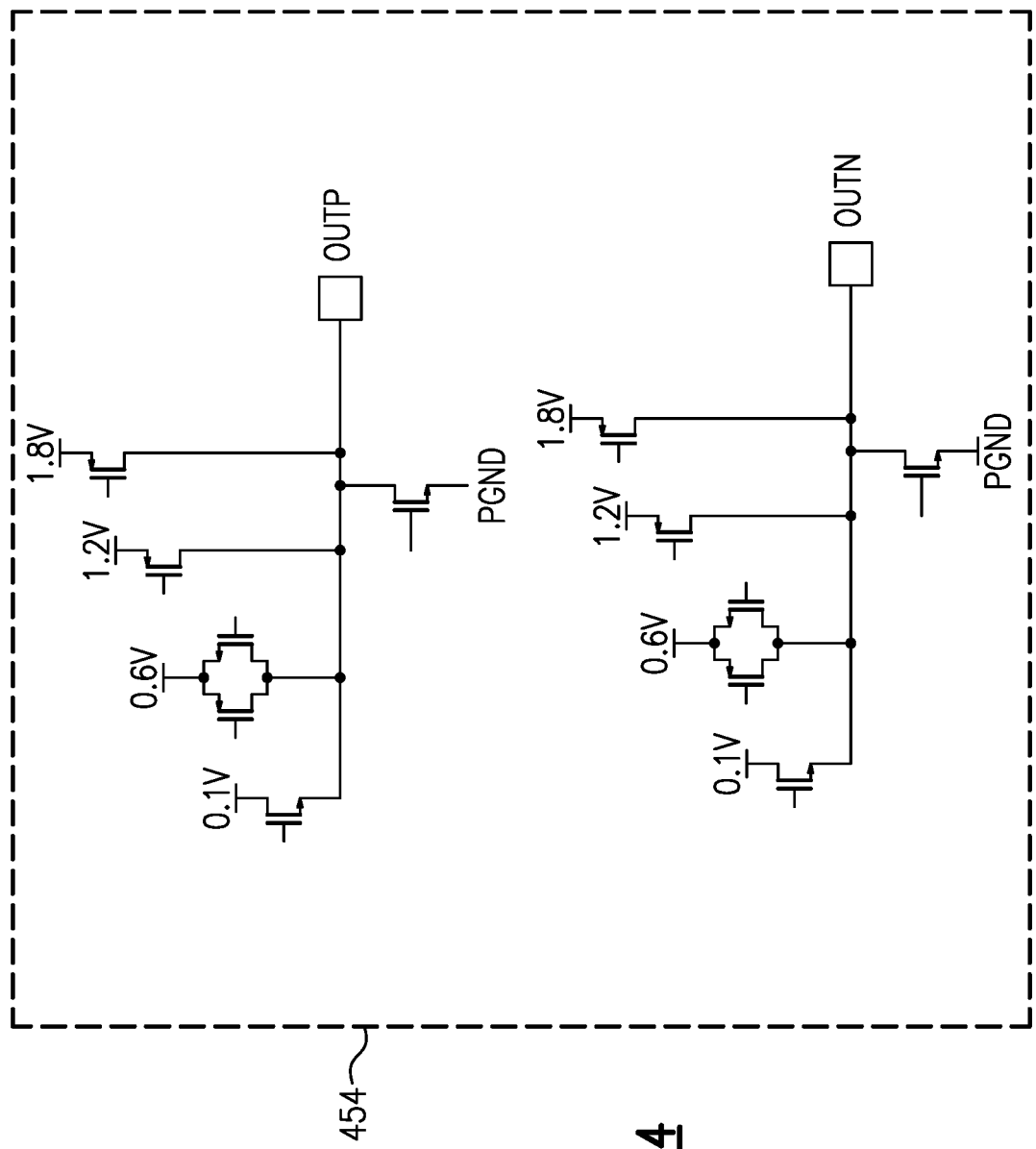
FIG. 4 is an example circuit of a portion of the output driver of FIG. 1 according to aspects of the present disclosure.

FIG. 4 illustrates an example circuit 454 of a portion of the output driver 150 of FIG. 1. In particular, the example circuit 454 of FIG. 4 illustrates a portion of the voltage supply selector 254 of FIG. 2. FIG. 4 illustrates an OUTP and an OUTN, corresponding to an embodiment that supplies power differentially across the switching circuit 252, with the OUTP and OUTN representing the respective positive and negative connections to the switching circuit 252. The power supply lines marked as $V_M$ and $V_H$, and the PGND ground connection are illustrated with respective transistors in-line to control the switching of which power supply voltage is connected to the OUTP and OUTN, and therefore the switching circuit 252. In this manner, the gates of the respective transistors can be controlled to determine which power supply voltage level, or combination thereof, is coupled to the switching circuit 252. These switches/transistor gates of the voltage supply selector 254 may be controlled by the supply voltage monitor 244.

FIG. 4 also illustrates $V_L$ and $V_{LL}$ power supply voltage levels or voltage rails. It will be appreciated that the higher voltage rails (the $V_M$ and $V_H$ voltage rails in the illustrated example) may correspond to external voltage supplies, while the lower voltage rails (the $V_L$ voltage rail in the illustrated example) may correspond to an onboard/chip voltage supply. The $V_{LL}$ voltage rail may then be a stepped down voltage rail of the chip voltage supply. In some embodiments, $V_L$ and $V_{LL}$ may be output through low dropout (LDO) regulators. Although these regulators may have poor efficiency in supplying the low output voltages, the reduction of the switching loss as the transistor (or those transistors of the switching circuit 252) are turned on and off at the low output voltages may more than compensate for the LDO inefficiency, resulting in an amplifier with very low power consumption and very high efficiency.

Returning to FIG. 2, the pulse controller 240 receives an input from the ADC 130 corresponding to the difference between the analog audio signal output by the DAC 110 and the drive signal that arrives at the subtractor from the feedback loop 180. In some examples, the input may correspond to a requested output in volt seconds. The pulse controller 240 uses the input to determine which power supply voltage level should be used and how wide the pulses should be based on this power supply voltage to generate the requested output in the output driver 250. In particular, during each loop cycle, the supply voltage monitor 244 may compare the input from the ADC 130 to one or more thresholds based on the amount of pulse energy that it is possible to produce with each of the plurality of power supply voltages. If the supply voltage monitor 244 determines, based on this comparison, that the currently selected power supply voltage is able to provide the pulse energy requested by the input (and that a lower power supply voltage would not be able to provide the requested pulse energy more efficiently), then the supply voltage monitor 244 may maintain the configuration of the voltage supply selector 254.

The pulse generator 242 may generate a modulation signal based on the input from the ADC 130 and the voltage of the power supply voltage that is currently coupled to the switching circuit 252 by the voltage supply selector 254. The modulation signal may then be used to control the switching of the switching circuit 252 to generate an amplified drive signal based on the input from the ADC 130 and the audio content to be reproduced by the loudspeaker 170.

It will be appreciated that the respective transistors for the selected voltage may couple the power supply voltage to the switching elements of the switching circuit 252, or alternatively the respective transistors for the selected voltage may be switched on and off (i.e., act as the switching elements of the switching circuit 252) in response to the various pulse widths output by the pulse generator 242.

In some embodiments, the output driver 250 is an H-bridge amplifier and the switching circuit 252 is an H-bridge circuit. An H-bridge, sometimes referred to as a "full bridge", is a drive structure used in, for example, class D amplifiers. Typically, there are four switching elements within the bridge. These four elements, or switches, are turned on in pairs, either high left and lower right, or lower left and high right; however, both switches on the same "side" of the bridge are not turned on at the same time. If both switches on one side of a bridge are turned on, a short circuit, or at least a relatively low resistance path, would be created between the coupled power supply and the ground, which is typically referred to as a shoot through current. Each of the drivers may comprise various electrical components such as transistors, capacitors, and diodes, for example. This bidirectional drive offers an improved output drive signal for devices with a limited voltage supply, such as mobile devices operating on a battery voltage.

If the supply voltage monitor 244 determines, based on the comparison of the input from the ADC 130 to a threshold, that the currently selected power supply voltage is not able to provide the pulse energy requested by the input, then it will be necessary to transition the configuration of the voltage supply selector 254 to couple a higher voltage supply to the switching circuit 252. In practice, the determination by the ADC 130 of the required pulse energy will take up some of the available clock time, which reduces the number of clock cycles that the pulse generator 242 can use to output pulses. The reduction in available clock cycles may lead to a maximum modulation value of around 75%, though greater or lesser values are also possible. Accordingly, in some examples, the maximum modulation value may be set to be the threshold for transitioning to the next highest power supply voltage. It will be appreciated that the threshold may be set slightly lower to provide headroom and to avoid saturation of the pulse controller 140 and feedback loop 180, which may cause the amplifier 100 to become unstable and generate audio clipping in the audio output reproduced by the loudspeaker 170. The transition from one voltage supply to a different voltage supply may be configured to take place at the end of a clock cycle. The system may be configured such that there are multiple clock cycles per audio sample to be reproduced. In this manner, the system may be able to reconfigure in time to produce the requested pulse energy/drive signal within the timeframe of the audio sample to be reproduced.

If the supply voltage monitor 244 determines, based on the comparison of the input from the ADC 130 to a threshold, that the requested pulse energy could be more efficiently provided by a wider pulse modulating a lower voltage supply connected to the switching circuit 252 instead of the currently selected power supply voltage, then the supply voltage monitor 244 may cause the voltage supply selector 254 to transition the system accordingly by coupling a lower voltage supply to the switching circuit 252. While the transition requires power to be expended in changing the state of the relevant transistors and charging/discharging associated capacitances, it will be appreciated that the subsequent reduction in voltage drop switching losses (due to the lower voltage supply being matched with smaller resistor values and smaller transistors having a lower gate capacitance) across the transistors of the switching circuit 252 as they are modulated according to the pulse train generated by the pulse generator 242 would result in a reduction in current consumption of the amplifier over time. In this manner, the amplifier 100 may enable lower power requirements for operation and provide an efficient driving signal for the loudspeaker load connected to the amplifier output. The amplifier 100 can receive a digital signal related to media content and convert the digital signal to an analog signal to output to the speaker load.

However, the presence of the feedback loop 180 may cause instabilities in the control of the voltage supply selector 254 by the supply voltage monitor 244 due to changing measurement errors in the measurement of the drive signal output by the output driver 250 as the system transitions from one voltage supply level to another. The drive signal measurements are performed by a power supply measurement device having a finite accuracy and precision, which can cause the aforementioned errors in the measurement of the drive signal.

In practice, each power supply voltage may use its own transistor for driving the voltage from the power supply to the output of the output driver 250. These different transistors may have varying resistances, for example due to manufacturing tolerances, or due to different transistors being used for each voltage level. For example, some transistors may be optimized to provide power by minimizing the gate capacitance. There may also be differing delays in the production of the measurement result due to the charging of different capacitors that may be used in respective portions of the sensing circuit 165 for measure the respective power supply voltages. The differing delays would then impact the value output by the ADC 130 and input into the pulse controller 240, resulting in a slightly different pulse width being generated by the pulse generator 242 compared to the input and drive voltages and/or signals. This in turn means that a slightly different gain output would then be requested even if the input and drive voltage itself had not changed.

These aforementioned errors in the measurement can provide some fluctuation that can lead to the measurement value alternating on either side of the threshold value for transitioning from one power supply voltage level to another. In particular, the gain of the current cycle may be determined to be too low and accordingly the supply voltage monitor 244 may cause the voltage supply selector 254 to increase the power supply voltage at the end of the cycle with the next cycle beginning with the new higher voltage. However, it may then be determined that the previous pulse actually represented an overdriving of the drive signal in comparison to that which was intended due to the gain on the errors in the previous configuration. This means that the following pulses would have a reduced width to balance out the overdriving. However, if the lower pulse energy is then determined to be below a corresponding threshold for reducing the power supply voltage level, the supply voltage monitor 244 may cause the voltage supply selector 254 to move back down to the lower power supply voltage in the following cycle. The new lower power supply voltage will again have a different amount of error in the opposite direction that may result in the threshold to move up voltage rails being exceeded again. Put another way, the voltage supply selector 254 may switch between a higher voltage supply rail and a lower voltage supply rail, as often as every clock cycle, because of the measurement errors.

In this manner, the system is liable to begin switching power supply voltage rails every other cycle due to this gain error. Not only is this an inefficient mode of operation, the cyclic oscillation of the power supply level in the output driver 250 may act on any non-linearities in the amplifier 100 and down-convert these effects to the audio band of frequencies, resulting in a noisy operation of the amplifier 100. In some circumstances, the oscillation may further result in instability of the amplifier's operation.

In order to combat the inefficient, noisy, and potentially unstable operation caused by switching between supply rails too often, a timer may be added to the supply voltage monitor 244 such that, after the supply voltage monitor causes the voltage supply selector 252 to transition to a higher voltage power supply, the supply voltage monitor 244 will not cause the voltage supply selector 252 to transition, or indeed may prevent transition, to a lower voltage power supply until after a given time period has elapsed, even if the input to the pulse controller 240 during this time period would suggest (potentially due to the measurement errors discussed above) that it would be more efficient to transition back to a lower power supply voltage.

By maintaining the voltage supply to the switching circuit 252 at the higher voltage, the amplifier block 260 should be able to produce the desired pulse energy, since lower pulse energies can still be generated by correspondingly narrow pulse widths, albeit at a potentially lower efficiency than might otherwise be obtained at a lower voltage. It should also be appreciated that the measurement errors dampen over time. Accordingly, the error signal from the feedback loop 180 may stabilize during this time period. The voltage controller 240 and/or voltage supply monitor 244 may determine, by comparison with the relevant thresholds, that the higher power supply voltage is the appropriate configuration of operation based on the current audio sample values. The arrangement of the present disclosure may therefore prevent undesirable and unnecessary oscillation of the power supply voltage level coupled to the switching circuit 252.

After expiry of the time period, the supply voltage monitor 244 may re-evaluate whether it would be desirable to switch to a lower voltage power supply to improve the efficiency of operation. In the event that the supply voltage monitor 244 determines at that stage, based on the comparison of the input from the ADC 130 to the threshold, that the requested pulse energy is low enough (e.g., that the currently selected power supply voltage will result in the generation of narrow pulse widths in order to provide the requested pulse energy, where the pulse energy could be more efficiently provided by a wider pulse modulating a lower voltage supply connected to the switching circuit 252), the supply voltage monitor 244 may cause the voltage supply selector 254 to transition the amplifier system accordingly, for example, by coupling the lower voltage supply to the switching circuit 252 and decoupling the higher voltage supply. Thus, the supply voltage monitor 244 may be configured to prevent the voltage supply selector 252 from reducing the voltage of the power supply input for a first time period. After the expiration of the first time period, the voltage supply monitor 244 may re-evaluate whether it would be desirable to reduce the voltage input based on the threshold comparison to improve overall efficiency of the amplifier 100. In some embodiments, the hold time period may be set to around 2 ms, which may correspond to around 6 clock cycles.

By introducing the timer having a given time period to prevent the voltage supply selector 254 from reducing the voltage of the power supply input as described herein, a certain amount of hysteresis is introduced into the control of the power supply voltage.

The hysteresis may be increased by using different threshold values for determining whether to move from a first power supply voltage to a second higher power supply voltage and whether to move from the second power supply voltage to the lower first power supply voltage. To optimize the efficiency of the amplifier 100, it is desirable to set these two thresholds to be relatively close together, as otherwise this would lead to a higher voltage than necessary being used for an extended period of time when a lower voltage rail could provide the same pulse energy with an improved efficiency. Attempting to suppress the above power supply oscillation purely by increasing the gap between these two threshold values would result in a comparatively wide gap that would result in an amplifier having a lower overall efficiency.

As an example of one method of producing a desired pulse in accord with aspects of FIG. 2, a threshold width may be determined, preset, or programmable. The threshold width may be a maximum width for any pulse generated by the pulse generator 242. The maximum energy may be equal to the magnitude of the pulse times the pulse's width, where the magnitude is determined by the currently connected supply voltage selected by the voltage supply selector 254. In some examples, if the maximum energy possible is less than the requested energy for the pulse, the system may select a higher supply voltage so that a pulse with the requested energy and a pulse width that does not exceed the threshold width can be produced. In some examples, if the maximum energy possible could be provided by a pulse having a lower magnitude and a width that does not exceed the threshold width, the system may select a lower supply voltage to produce a pulse with the requested energy.

Figure 3:
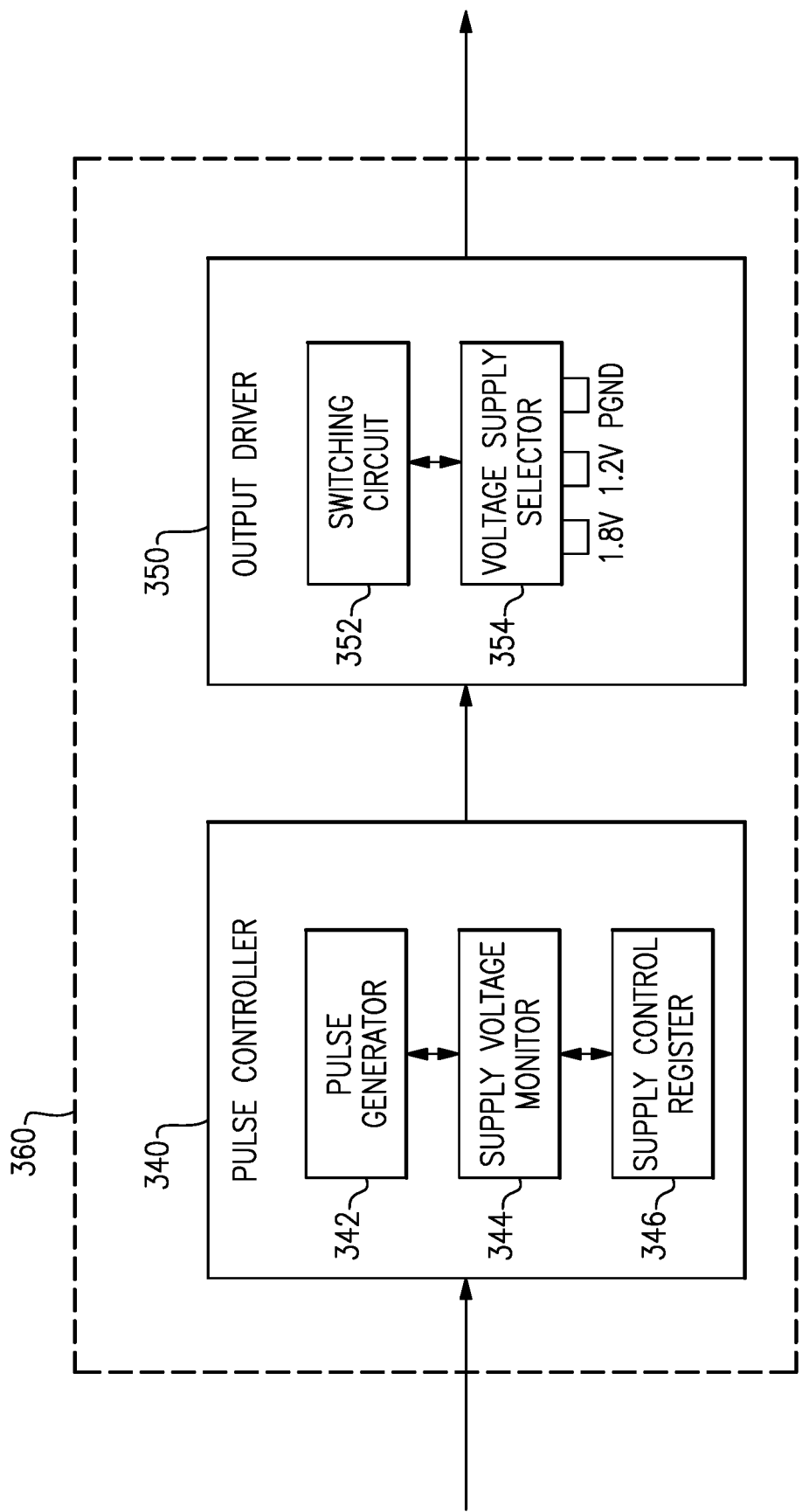
FIG. 3 is a block diagram of a further example amplifier block according to aspects of the present disclosure.

FIG. 3 is a block diagram of an example amplifier block 360 according to aspects of the present disclosure. In a similar manner to the amplifier block 260, the amplifier block 360 includes a pulse controller 340 and an output driver 350. The pulse controller 340 includes a pulse generator 342 and a supply voltage monitor 344, and the output driver 350 includes a switching circuit 352 and a voltage supply selector 354. FIG. 3 corresponds to the configuration of FIG. 2, except that the pulse controller 340 of FIG. 3 further includes a supply control register 346. The supply voltage monitor 344 may be configured to store the threshold values in the supply control register 346. As described above, in certain embodiments two threshold values may be configured for each pair of adjacent power supply voltage levels (depending on whether the lower or higher power supply voltage of the pair is currently coupled to the power supply input of the switching circuit 352)—accordingly an arrangement having five different voltage supply levels may have eight different threshold values. More generally, an arrangement having n different voltage supply levels may have 2(n−1) different threshold values.

The supply voltage monitor 344 may be configured to store values indicating the power supply voltage that is currently being used for pulse generation as well as the power supply voltage above or below the currently used supply that is closest to the currently required pulse energy such that it can be considered to be the adjacent supply in the supply control register 346. Accordingly, the supply control register 346 may store the active state of which power supply voltage levels are being considered in the modulation of the audio signal. The supply voltage monitor 344 may refer to the on-chip supply control register 346 to improve the access speeds to the active state information.

In some embodiments, an amplifier block of a switching audio amplifier having one or more features as described herein can be implemented in numerous products. For example, FIG. 5 shows that in some embodiments, an amplifier block 560 (which may correspond to any one of the amplifier blocks 160, 260, or 360 for example) having one or more features as described herein may be implemented on a semiconductor die 525 having a substrate, the semiconductor die forming part of a packaged module 500.

Figure 6:
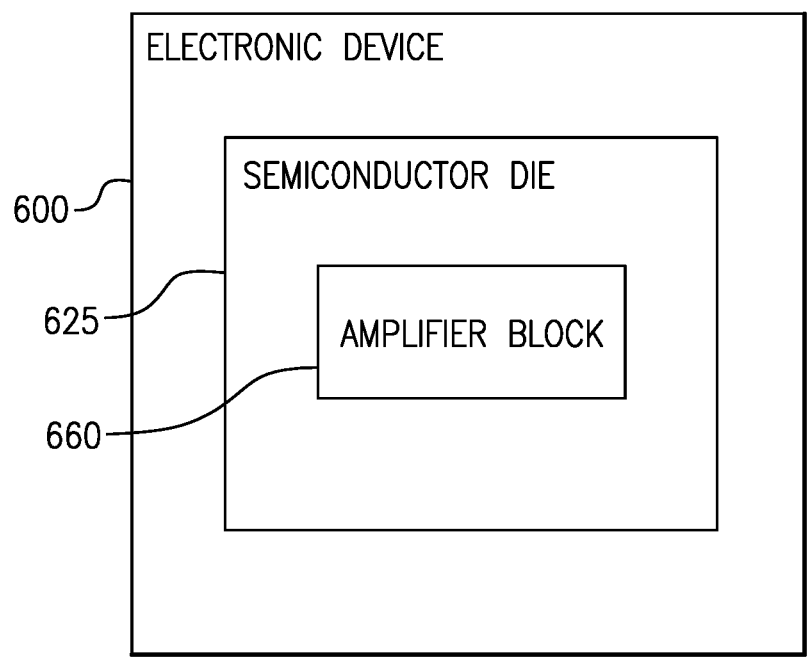
FIG. 6 illustrates that in some embodiments, an amplifier block having one or more features as described herein can be implemented on one or more semiconductor die, and such die can be mounted on the substrate of an electronic device.

FIG. 6 shows that in some embodiments, an amplifier block 660 (which may correspond to any one of the amplifier blocks 160, 260, 360 for example) having one or more features as described herein may be implemented on a semiconductor die 625 having a substrate, the semiconductor die forming part of an electronic device 600.

Figure 5:
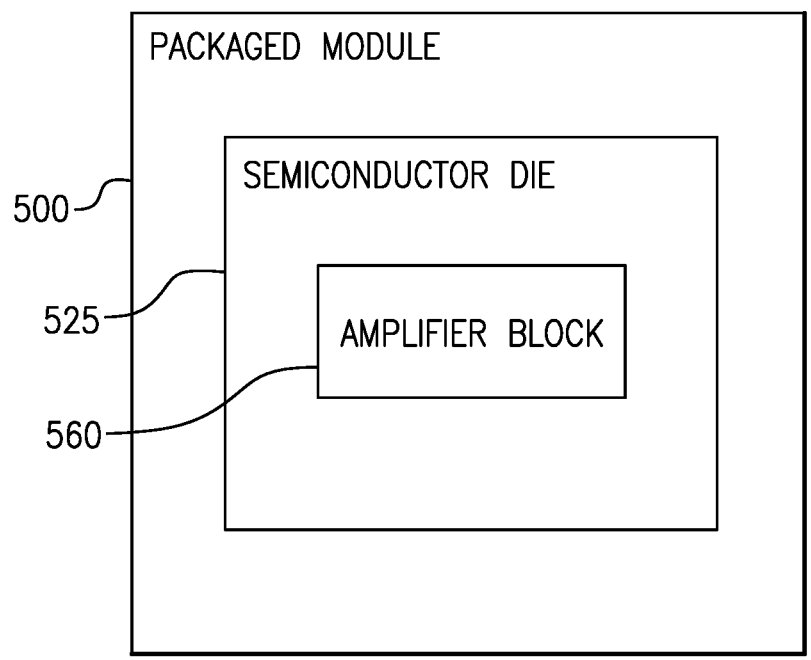
FIG. 5 illustrates that, in some embodiments, an amplifier block having one or more features as described herein can be implemented on one or more semiconductor die, and such die can be mounted on the substrate of a packaged module.

The embodiments of FIGS. 5 and 6 may be implemented using chip-scale packages on a single die that is directly surface mountable with a redistribution layer overlaid to provide routing connectivity. Aspects of this disclosure can be implemented in various electronic devices. Examples of the electronic devices can include, but are not limited to, consumer electronic products such as low power consumer electronic devices, and parts of the consumer electronic products such as semiconductor die and/or packaged modules. Examples of the consumer electronic products can include any electronic device which may include a loudspeaker, and in particular a low power electronic device. This may include, for example, mobile devices, or headphones such as wireless headphones.

Figure 7:
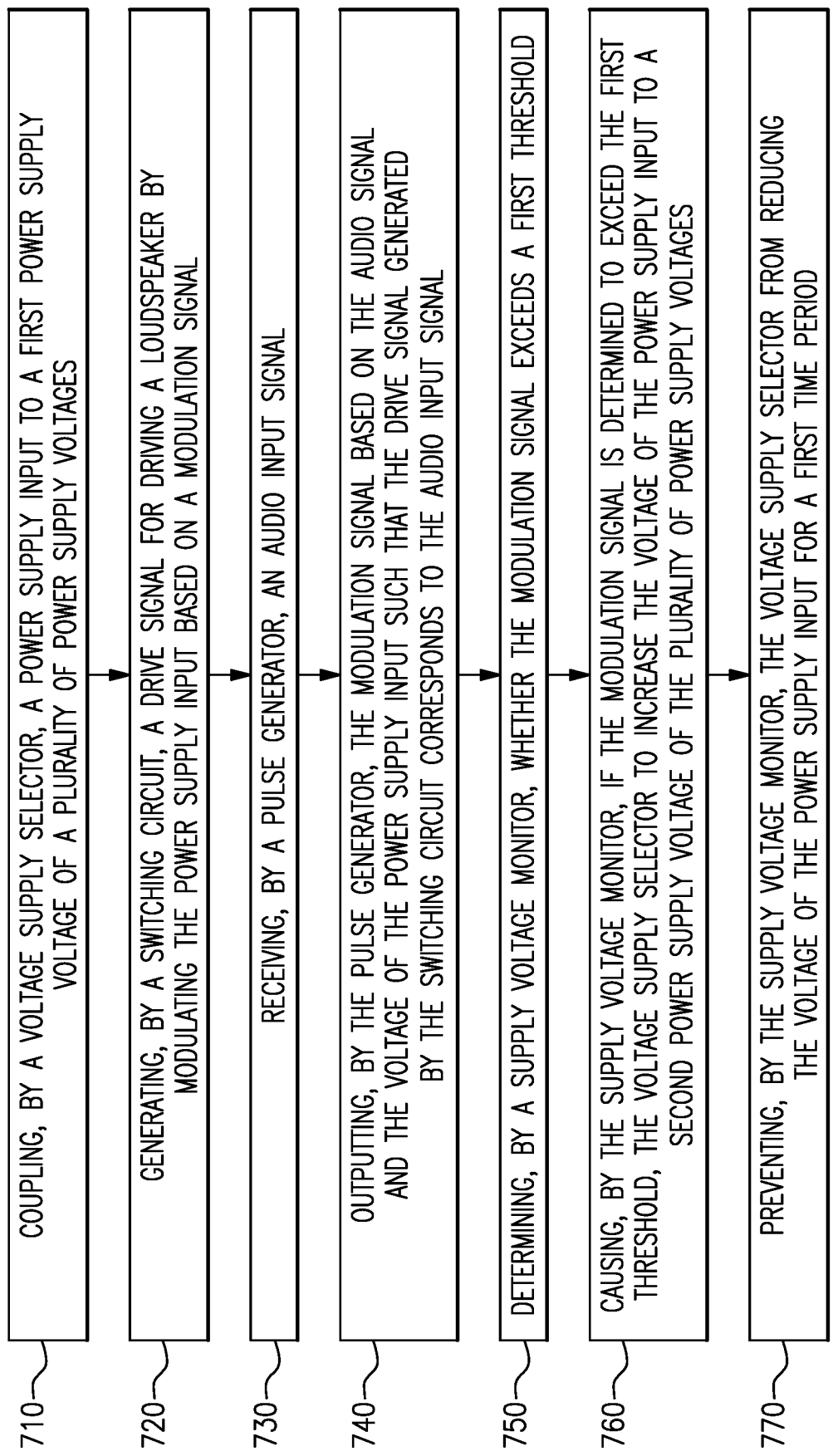
FIG. 7 is a flowchart illustrating an example method for controlling an example amplifier block according to aspects of the present disclosure.

In a further aspect of the present disclosure, a method according to FIG. 7 is provided for controlling a switching audio amplifier. At act 710, the method includes coupling, by a voltage supply selector, a power supply input to a first power supply voltage of a plurality of power supply voltages. At act 720 the method includes generating, by a switching circuit, a drive signal for driving a loudspeaker by modulating the power supply input based on a modulation signal. At act 730 the method includes receiving, by a pulse generator, an audio input signal. At act 740 the method includes outputting, by the pulse generator, the modulation signal based on the audio input signal and the voltage of the power supply input such that the drive signal generated by the switching circuit corresponds to the audio input signal.

At act 750 the method includes determining, by a supply voltage monitor, whether the modulation signal exceeds a first threshold. At act 760 the method includes causing, by the supply voltage monitor, if the modulation signal is determined to exceed the first threshold, the voltage supply selector to increase the voltage of the power supply input by coupling the power supply input to a second power supply voltage of the plurality of power supply voltages. At act 770 the method includes preventing, by the supply voltage monitor, the voltage supply selector from reducing the voltage of the power supply input for a first time period.

For completeness, it is noted that the flowchart of FIG. 7 illustrates the operation of an example implementation of methods according to the present disclosure. Each block in the flowchart may represent a module comprising one or more executable computer instructions, or a portion of an instruction, for implementing the relevant logical function specified in the block. The order of blocks in FIG. 7 is only intended to be illustrative of an example. In alternative implementations, the logical functions illustrated in particular blocks may occur out of the order noted in FIG. 7. For example, the processes associated with two blocks may be carried out simultaneously or, depending on the functionality, in the reverse order. Moreover, each block in the flowchart may be implemented in software, hardware or a combination of software and hardware.

While the above disclosure is applicable to conventional amplifiers having a low output impedance, it will be appreciated that the teaching of the present application may also be applied to amplifiers having a high output impedance, or operable in a high output impedance mode of a plurality of modes.

Conventional amplifiers having a low output impedance include a feedback circuit that measures the output voltage and closes the loop to make sure that the actual output matches the requested voltage based on the audio content that is desired to be reproduced in the connected loudspeakers. However, stray magnetic fields can be coupled into the PCB board wiring, which may induce a voltage in the PCB board wiring. Because the output impedance is very low, this induced voltage goes to the loudspeaker and is represented as noise/audio distortion in the reproduced audio. This can be particularly problematic in devices having co-located audio amplifiers and wireless transceivers, such as Wi-Fi, cellular or Bluetooth transceivers and/or power supplies. Co-located components may produce relatively high magnetic fields in close proximity to the audio amplifier and it can be difficult to mitigate the high magnetic fields using PCB board layout alone.

Since loudspeakers are current devices (where the current in the voice coil of the loudspeaker causes the loudspeaker magnet and the coupled loudspeaker cone to move), an audio amplifier in accordance with the above disclosure may be configured to operate in a current driving mode. As such, an amplifier in accordance with the above disclosure may be configured with a high output impedance to convert the drive voltage into a current in the amplifier output and to deliver this current to the speaker instead of the drive voltage itself. This means that the amplifier can drive a specific current and any voltage that appears across the wire will be absorbed by the amplifier and adjust its voltage to give the right current. Any magnetic fields inducing a voltage drop across the wires would then not affect the current, and therefore not affect the audio output of the connected loudspeaker in the form of an undesired audible artefact. The high output impedance current drive mode may be particularly suited to operation audio signals having a low gain, where noise would be particularly noticeable. At higher audio signal gain, it may be more efficient to operate in a low output impedance voltage drive mode, where the noise may not be as easy to discern. The high output impedance current drive mode is typically less efficient because the feedback loop typically uses a sensing circuit having sense resistors positioned in series to the loudspeaker load for converting the output voltage into a current. The sense resistor may be configured to have a similar resistance to that of the loudspeaker load and accordingly half of the voltage may be directed away from driving the loudspeaker load.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A switching audio amplifier, comprising:
a voltage supply selector configured to couple a power supply input to a first power supply voltage of a plurality of power supply voltages;
a switching circuit configured to generate a drive signal for driving a loudspeaker by modulating the power supply input based on a modulation signal;
a pulse generator configured to receive an audio input signal and to output the modulation signal based on the audio input signal and the voltage of the power supply input such that the drive signal generated by the switching circuit corresponds to the audio input signal; and
a supply voltage monitor configured to determine whether the modulation signal exceeds a first threshold, the supply voltage monitor being configured to increase the voltage of the power supply input by causing the voltage supply selector to couple the power supply input to a second power supply voltage of the plurality of power supply voltages responsive to determining that the modulation signal exceeds the first threshold, the supply voltage monitor being configured to prevent the voltage supply selector from reducing the voltage of the power supply input for a first time period.

2. The switching audio amplifier of claim 1 wherein the second power supply voltage is higher than the first power supply voltage.

3. The switching audio amplifier of claim 1 further comprising a feedback loop, the feedback loop configured to measure the drive signal output by the switching circuit and to provide negative feedback error correction between the drive signal and the audio input signal.

4. The switching audio amplifier of claim 1 wherein the supply voltage monitor is configured to reduce the voltage of the power supply input by causing the voltage supply selector to couple the power supply input to the first power supply voltage provided the modulation signal is less than a second threshold and the first time period has expired.

5. The switching audio amplifier of claim 4 wherein the second threshold is lower than the first threshold.

6. The switching audio amplifier of claim 1 wherein the switching circuit is configured to generate a differential drive signal for driving the loudspeaker.

7. The switching audio amplifier of claim 1 wherein the supply voltage monitor is configured to control the voltage supply selector by encoding a desired voltage of the power supply input in the height of the modulation signal pulses output by the pulse generator.

8. The switching audio amplifier of claim 1 wherein the supply voltage monitor is configured to control the voltage supply selector by encoding a desired voltage of the power supply input in a code that is communicated to the voltage supply selector.

9. The switching audio amplifier of claim 1 wherein the supply voltage monitor is configured to store the first threshold in a supply control register.

10. The switching audio amplifier of claim 1 wherein the voltage supply selector comprises a plurality of transistors configured to open or close to make or break a connection between the power supply input and the plurality of power supply voltages.

11. The switching audio amplifier of claim 1 wherein the modulation signal is a pulse width modulation signal or a pulse density modulation signal.

12. A method for controlling a switching audio amplifier, the method comprising:
coupling, by a voltage supply selector, a power supply input to a first power supply voltage of a plurality of power supply voltages;
generating, by a switching circuit, a drive signal for driving a loudspeaker by modulating the power supply input based on a modulation signal;
receiving, by a pulse generator, an audio input signal;
outputting, by the pulse generator, the modulation signal based on the audio input signal and the voltage of the power supply input such that the drive signal generated by the switching circuit corresponds to the audio input signal;
determining, by a supply voltage monitor, whether the modulation signal exceeds a first threshold;
causing, by the supply voltage monitor, responsive to determining that the modulation signal exceeds the first threshold, the voltage supply selector to increase the voltage of the power supply input by coupling the power supply input to a second power supply voltage of the plurality of power supply voltages; and
preventing, by the supply voltage monitor, the voltage supply selector from reducing the voltage of the power supply input for a first time period.

13. The method of claim 12 wherein the second power supply voltage is higher than the first power supply voltage.

14. The method of claim 12 further comprising measuring, by a feedback loop, the drive signal output by the switching circuit and providing negative feedback error correction between the drive signal and the audio input signal.

15. The method of claim 12 further comprising reducing, by the supply voltage monitor, the voltage of the power supply input by causing the voltage supply selector to couple the power supply input to the first power supply voltage provided the modulation signal is less than a second threshold and the first time period has expired.

16. The method of claim 15 wherein the second threshold is lower than the first threshold.

17. The method of claim 13 wherein the method further comprises generating, by the switching circuit, a differential drive signal for driving the loudspeaker.

18. The method of claim 12 further comprising controlling, by the supply voltage monitor, the voltage supply selector by encoding a desired voltage of the power supply input in the height of the modulation signal pulses output by the pulse generator.

19. The method of claim 12 further comprising controlling, by the supply voltage monitor, the voltage supply selector by encoding a desired voltage of the power supply input in a code that is communicated to the voltage supply selector.

20. The method of claim 12 further comprising opening or closing, by the voltage supply selector, a plurality of transistors to make or break a connection between the power supply input and the plurality of power supply voltages.

21. A packaged module comprising:
a packaging substrate;
a switching audio amplifier implemented on the packaging substrate and comprising a voltage supply selector configured to couple a power supply input to a first power supply voltage of a plurality of power supply voltages;
a switching circuit configured to generate a drive signal for driving a loudspeaker by modulating the power supply input based on a modulation signal;
a pulse generator configured to receive an audio input signal and to output the modulation signal based on the audio input signal and the voltage of the power supply input such that the drive signal generated by the switching circuit corresponds to the audio input signal;
and a supply voltage monitor configured to determine whether the modulation signal exceeds a first threshold, the supply voltage monitor being configured to increase the voltage of the power supply input by causing the voltage supply selector to couple the power supply input to a second power supply voltage of the plurality of power supply voltages responsive to determining that the modulation signal exceeds the first threshold, the supply voltage monitor being configured to prevent the voltage supply selector from reducing the voltage of the power supply input for a first time period.

* * * * *